United States Patent [19]

Miller

[11] Patent Number: 5,871,136
[45] Date of Patent: Feb. 16, 1999

[54] MICROPOSITIONER FOR ULTRASONIC BONDING

[75] Inventor: Charles F. Miller, Anaheim Hills, Calif.

[73] Assignee: West Bond, Inc., Anaheim, Calif.

[21] Appl. No.: 773,637

[22] Filed: Dec. 24, 1996

[51] Int. Cl.⁶ .......................... B23K 20/10; B23K 37/02
[52] U.S. Cl. ....................................... 228/4.5; 228/180.5
[58] Field of Search ................................... 228/4.5, 180.5

[56] References Cited

U.S. PATENT DOCUMENTS

| | | | |
|---|---|---|---|
| 3,474,685 | 10/1969 | Miller | 74/491 |
| 3,489,027 | 1/1970 | Christy | 228/4.5 |
| 3,626,590 | 12/1971 | Miller | 228/4.5 |
| 3,773,240 | 11/1973 | Heim | 228/4.5 |
| 4,475,681 | 10/1984 | Ingle | 228/4.5 |

*Primary Examiner*—P. Austin Bradley
*Assistant Examiner*—Jeffrey T. Knapp
*Attorney, Agent, or Firm*—William L. Chapin

[57] ABSTRACT

A micropositioner affording the ability to precisely move the tip of an ultrasonic bonding tool relative to a miniature workpiece such as a microcircuit includes a pantograph-like input manipulator mechanism coupled by a single ball joint coupling to a follower mechanism which supports an ultrasonic transducer support housing from which a transducer and bonding tool attached thereto protrudes. In the preferred embodiment, the input manipulator includes a longitudinally outwardly protruding control arm having a control knob at the outer longitudinal end thereof, for grasping between the thumb and fingers of a human operator. The control arm is coupled to the outer lateral end of a four-bar parallelogram linkage comprising part of a pantograph mechanism, while the inner lateral end of the pantograph mechanism is pivotably connected through vertically and horizontally disposed pivot support bearings to a support structure. Motions of the input control ball are followed by, a ball joint attached to the pantograph mechanism, and coupled by the ball joint to the follower mechanism. By a suitable choice of spacings between the pivot axes of the pantograph mechanism support bearings and ball joint, the tip of the bonding tool is made to move in coordinate directions of a second coordinate system containing the tool tip in precisely scaled fractions of corresponding motions of the control knob in a first coordinate system thereof. In the preferred embodiment a tool support plate supporting the transducer housing is longitudinally slidably mounted to a tool support guide plate, which is in turn pivotably supported by a yoke having a yaw pivot bearing allowing lateral motion of the tool tip. The yoke is pivotably mounted by a pitch pivot bearing to the support structure, thereby permitting pivotal motion in a vertical plane of the yoke, tool support plate and tool tip. Preferably, the longitudinal slide axis of the tool tip, and the pivot axes of the rear pitch and yaw pivots all intersect at a common point, thereby assuring completely orthogonal motions of the tool tip in three orthogonal coordinate directions that are precisely scaled fractions of corresponding control knob motions.

20 Claims, 12 Drawing Sheets

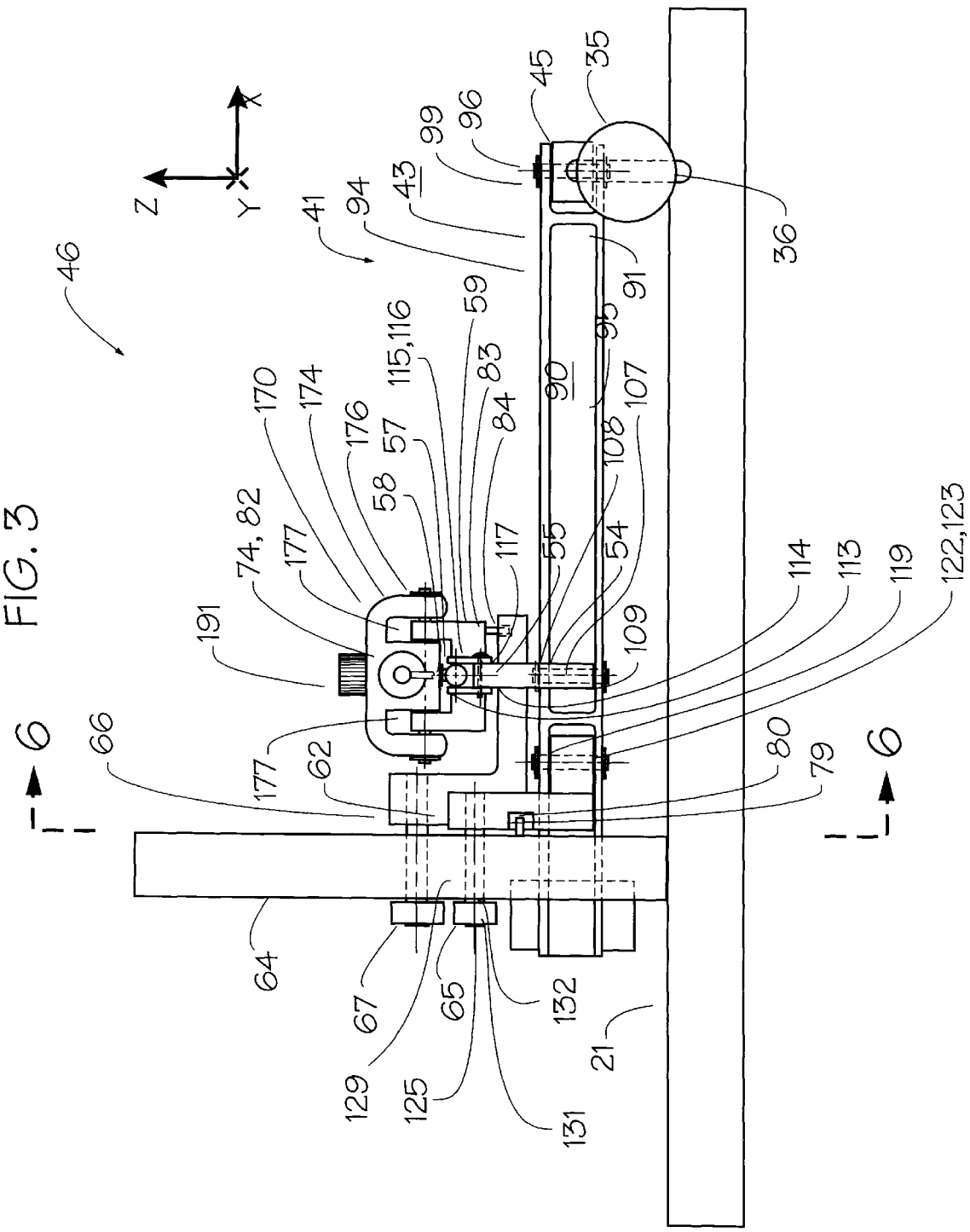

MICROPOSITIONER FOR ULTRASONIC BONDING

BACKGROUND OF THE INVENTION

A. Field of the Invention

The present invention relates to apparatus useful for moving a tool or similar implement into contact with a workpiece. More particularly, the invention relates to a micropositioner apparatus for positioning the tip of an ultrasonic or similar wire bonding tool at precisely determinable locations relative to a microcircuit or similar workpiece, moving the tip into contact with the workpiece to form a bond, and withdrawing the tip upon completion of a bond, all by manual operation of a manipulator input mechanism comprising part of the micropositioner.

B. Description of Background Art

The invention of the transistor in 1948 may well have been the most important technological development of the $20^{th}$ century. Substitution of transistors for vacuum tubes made it possible to construct computers of substantially reduced size and cost, much greater speed and data handling capability, and greatly reduced power consumption than vacuum tube computers. In the latter part of the 1950's, transistors were introduced to a wide variety of military, industrial and consumer products.

In the early 1960's, integrated circuits were introduced. Integrated circuits contain a number of transistors and interconnecting circuit elements which together comprise an operable electronic circuit, such as a logic element, amplifier, or memory element. While the first integrated circuits contained just a few transistors, integrated circuits are now being manufactured which contain tens or even hundreds of thousands of transistors on a single semiconductor die or chip.

Integrated circuits are fabricated from thin slices of a semi-conducting material such as silicon, germanium, or gallium arsenide. The slices are cut into small squares or rectangles referred to as chips or dice, ranging in size from squares about 100 mil. (0.100 inch) on a side to several hundred mils on a side. Transistors, diodes, resistors and interconnecting circuit paths are formed on the clip or die by diffusing impurities into selected regions of the chip, and by depositing various conducting paths and insulating layers onto the chip.

After a semi-conductor chip or die has been fabricated as described above, it must be attached to a base or carrier forming part of a package or container to protect the delicate die from damage. Prior to packaging, conductive pads providing input and output ports to the die must be electrically interconnected to more robust leads or terminals which extend outward through a container or package used to enclose the die. These interconnections are customarily made using fine aluminum or gold wires which are ultrasonically or thermosonically welded to the pads and leads by a bonding tool that applies ultrasonic energy, or a combination of heat and ultrasonic energy, to a bonding site. Since the connection pads of a microcircuit are extremely tiny and closely spaced, great precision is required in positioning the tip of a bonding tool relative to the microcircuit.

In response to a perceived need for an apparatus capable of precisely positioning the tip of an ultrasonic transducer used to form wire bonds on microcircuit chips, the present inventor invented a micro-positioner apparatus employing a novel pantograph-type manipulator input mechanism. That apparatus which was disclosed in the inventor's U.S. Pat. No. 3,474,685, that issued on Oct. 28, 1969, has proven to be highly effective in performing its intended function, and wire bonding apparatus employing the novel design concepts of the pantograph mechanism disclosed in that patent are used widely throughout the industry. However, the present inventor has found that certain aspects of the micropositioner disclosed in the U.S. Pat. No. 3,474,685 patent might be improved upon. For example, the allowable working or throat depth of the ultrasonic tool tip would preferably be larger. Also, the use of offset pivotable mountings for the transducer tool plate would desirably be minimized, thereby minimizing the requirement for springs to counter balance unbalanced forces exerted in supporting the tool plate by offset mountings. Moreover, it would be desirable to have a micropositioner apparatus in which various ultrasonic transducers and other bonding tool accessories such as wire spooling mechanisms, some of which might be substantially heavier than conveniently supportable by prior art micropositioners, could be used. Such a need arises, for example, in bonding the heavier wires required for connection to various electronic components such as wound coils. In view of the foregoing considerations, the present invention was conceived of.

OBJECTS OF THE INVENTION

An object of the present invention is to provide a micropositioner apparatus having a manually operable input mechanism or manipulator coupled to a tool holder mechanism, in which motions of the input mechanism in a first, manipulator coordinate system thereof cause precisely corresponding motions to follow in a tool holder mechanism in a second, tool coordinate system.

Another object of the invention is to provide a micropositioner mechanism for ultrasonic bonding tools which displaces an ultrasonic tool tip in the same coordinate directions as an input handle of a manipulator input mechanism which tool tip displacements may be in ratios other than one-to-one relative to the corresponding displacements of the manipulator input handle.

Another object of the invention is to provide a micropositioner apparatus including means for displacing a tool tip in orthogonal directions in a second, tool coordinate system in which the displacement distances may be in different ratios to corresponding displacements in a first, manipulator handle input-coordinate system.

Another object of the invention is to provide a micropositioner apparatus having a movable follower mechanism including a tool support structure which is movably supported with respect to a base structure solely by pivotable or slidable joints.

Another object of the invention is to provide a micropositioner mechanism having a follower mechanism movably supported with respect to a base structure without the use of polyaxial ball joints.

Another object of the invention is to provide a micropositioner apparatus having a manipulator input mechanism coupled to a follower mechanism by means of a single ball joint coupling.

Another object of the invention is to provide a micropositioner apparatus having a follower mechanism including a tool support structure, supported at the rear end thereof by two pivot joints and one sliding joint, the respective pivot axes and sliding axis intersecting at a common point.

Another object of the invention is to provide a micropositioner apparatus having a follower mechanism including a tool support structure which has at the rear end thereof a first pivot bearing having a horizontally disposed pivot axis allowing pivoting in a vertical plane of a tool support yoke, the tool support yoke including a second pivot bearing, the axis of which is perpendicular to said first pivot bearing axis, for lateral pivoting motion of said tool support structure, a slide joint having a slide axis which mutually perpendicular intersects said first and second pivot axes for permitting inward and outward movement of said tool support structure, and a front manipulator support bracket hanger having a third horizontally disposed pivot axis allowing the manipulator and front portion of the tool support structure to be pivoted in a vertical plane.

Various other objects and advantages of the present invention, and its most novel features, will become apparent to those skilled in the art by perusing the accompanying specification, drawings and claims.

It is to be understood that although the invention disclosed herein is fully capable of achieving the objects and providing the advantages described, the characteristics of the invention described herein are merely illustrative of the preferred embodiments. Accordingly, I do not intend that the scope of my exclusive rights and privileges in the invention be limited to details of the embodiments described. I do intend that equivalents, adaptations and modifications of the invention reasonably inferable from the description contained herein be included within the scope of the invention as defined by the appended claims.

SUMMARY OF THE INVENTION

Briefly stated, the present invention comprehends a micropositioner apparatus for moving the tip of an ultrasonic wire bonding tool to overlie a precisely determinable bonding location on the surface of a miniature microcircuit, moving the tip into contact with a selected bonding site to permit formation of a bond by application of ultrasonic energy to the bonding site, and withdrawing the tip upon completion of the bond. A preferred embodiment of a micropositioner apparatus according to the present invention includes a manually operable manipulator input mechanism coupled by means of a ball joint to a follower mechanism including a tool support structure. The manipulator input mechanism of the present invention includes a generally laterally and horizontally disposed, laterally elongated four-bar parallelogram linkage or pantograph mechanism. The pantograph mechanism has long straight front and rear parallel beam members, and short inner and outer linkage members pivotably joined by four separate pivot bearings to the front and outer lateral ends of both front and rear beam members. The outer linkage member has protruding forward from an outer lateral end thereof a longitudinally disposed, laterally pivotable control arm. The control arm has at the outer longitudinal end thereof a hand control ball or knob which may be grasped between the fingers and thumb of a human operator. The pantograph mechanism includes an elongated straight front manipulator arm or beam having an inner end which protrudes laterally inwards from the four-bar structure, and which is pivotably mounted by means of a generally vertically disposed, pantograph mechanism support pivot bearing to a front, manipulator hanger crank. This pivot bearing allows motion of the manipulator arm in a longitudinal "Y" direction.

The manipulator hanger crank is in turn pivotably mounted to a vertical support plate by a horizontally disposed hanger crank support pivot bearing, thus allowing the manipulator hanger crank to pivot in a vertical plane, and thereby allowing the manipulator beam arm to be moved upwards and downwards in a "Z" direction in response to corresponding motions of the manipulator control knob.

The four-bar linkage of the pantograph mechanism includes a generally longitudinally and horizontally disposed short inner linkage bar which is pivotably coupled at the rear end thereof by a rear inner pantograph bearing to a laterally elongated straight tie bar which is disposed parallel to and rearward of the manipulator beam arm. In the preferred embodiment, the tie bar is the same length but of smaller cross-section than the manipulator arm. The short inner linkage bar comprises part of the long leg of a manipulator bracket having the shape of a "J" lying in a vertical plane on its long leg, and is pivotably connected by means of a vertically disposed front inner pantograph pivot bearing to the pantograph manipulator arm. The manipulator bracket has a forwardly and upwardly protruding J-shaped section including a generally horizontally disposed portion of the long leg of the J, which protrudes forward through a cut-out front wall section of the manipulator arm. The manipulator bracket also has an upwardly protruding section, and an inwardly or rearwardly protruding section. The latter forms a coupling bar that partially overlies the manipulator beam arm and which protrudes rearward towards the front inner manipulator beam arm pivot axis.

A vertically disposed ball joint socket protrudes upwards from the coupling bar and receives a ball that protrudes downwards from a tool support plate of a follower structure, the vertical axis of the ball joint being located forward of the front inner manipulator beam arm pivot axis. Lateral motion of the manipulator control knob in the "X", i.e., left and right directions causes the outer short linkage bar to pivot about the axis of a front outer pantograph bearing joining it to the manipulator arm, and the outer linkage bar to pivot about a rear outer pantograph bearing pivot axis joining it to the rear tie bar. Thus constructed, the pantograph mechanism forms a parallelogram having front and rear parallel long legs consisting of the front manipulator beam arm and rear tie bar, and short parallel sides consisting of the inner and outer short linkage bars. Lateral relative motion between the front manipulator arm and rear tie bar in turn causes the inner short linkage bar to pivot about the front inner pantograph bearing axis, thereby moving the ball joint socket in a lateral direction. This motion of the control knob in an X direction in turn causes the tool support plate, which is coupled by means of a downwardly protruding ball to the ball joint socket that protrudes upwards from the manipulator bracket, to also move in an X direction. Since the longitudinal distance between the control ball and outer manipulator bar pivot is about 16 times greater than the distance between the ball joint vertical axis and the inner manipulator bar pivot, displacement of the ball joint axis and attached point of the tool support structure in the X direction are about 16 times smaller than corresponding motion of the hand control ball. However, since the tip of a tool attached to and protruding forward beyond the front edge of the tool support plate swings through a larger radius arc than the ball joint, the ratio between control ball axis movement and movement of the tool tip is reduced to about 8:1.

Motion of the control knob in the Y direction, i.e., longitudinally inwards and outwards, results in motion of the ball joint axis in the Y direction. However, since the distance between the vertical pivot pin of the pantograph mechanism support bearing joining the inner end of the manipulator arm to the manipulator hanger, and the inner pantograph bearing pivot, is about one-eighth the distance between the inner and outer front pantograph pivots, displacement of the ball joint in the Y direction is about one-eighth that of the corresponding motion of the control ball.

Motion of the control ball in the Z axis direction, i.e., up or down, causes the pantograph manipulator arm and attached hanger to pivot about the horizontally disposed axis of the hanger crank support pivot bearing joining the hanger to the vertical support plate. Since the longitudinal distance between the axis of the hanger crank support pivot bearing and the control ball is about eight times larger than the distance between the pivot axis and the vertically disposed ball joint axis, vertical motion of the tool support plate at this location is about one-eighth as large as vertical movement of the control knob. Because the radius arm for Z axis motions is the same as that for X axis motions, this ratio is also multiplied by a factor of two, resulting in a 4:1 ratio.

The longitudinally inward or rear end of the tool support plate is slidably supported between a pair of linear roller bearings mounted on the upper surface of a tool support guide plate. The guide plate in turn is pivotably joined by a vertical pivot bearing to a tool support yoke, the latter bearing allowing pivotal motion of the rear portion of the tool support plate in response to lateral, or X-axis motion of the ball joint. The tool support yoke is pivotably mounted to the rear portion of the vertical support plate by means of a pivot bearing having a horizontally disposed axis. This bearing permits parallel motion in a vertical plane of the rear portion of the tool support plate in response to vertical, or Z-axis motion of the ball joint.

When used to perform ultrasonic bonding, the micropositioner apparatus according to the present invention is provided with an ultrasonic transducer mount fastened to the upper surface of the tool support plate. In this configuration, the transducer mount assembly holds a longitudinally elongated ultrasonic bonding implement that includes an ultrasonic transducer and impedance matching horn which protrudes longitudinally forward beyond the front end of the tool support plate, and a bonding tool having a tip which depends perpendicularly downwards from the outer end of the horn. In the preferred embodiment, the longitudinal line of action of the tool tip along the Y axis, the Z axis of the tool support yoke pivot bearing, and the vertically disposed X axis pivot bearing axis of the rear tool support plate all intersect at a common point. This novel arrangement assures that no cross coupling exists between motions in the three coordinate directions. Thus, motion solely in the X, Y or Z directions of the input manipulator coordinate system, in which motions of the control knob are measured, result solely in x, y, or z axis motions in a translated coordinate system in which motions of the tool tip are measured.

BRIEF DESCRIPTION OF THE DRAWINGS

FIG. 3 is a front elevation view of the apparatus of FIG. 2.

DETAILED DESCRIPTION OF THE PREFERRED EMBODIMENTS

Referring now to FIGS. 1–11, a micropositioner apparatus according to the present invention is shown.

Figure 2A:
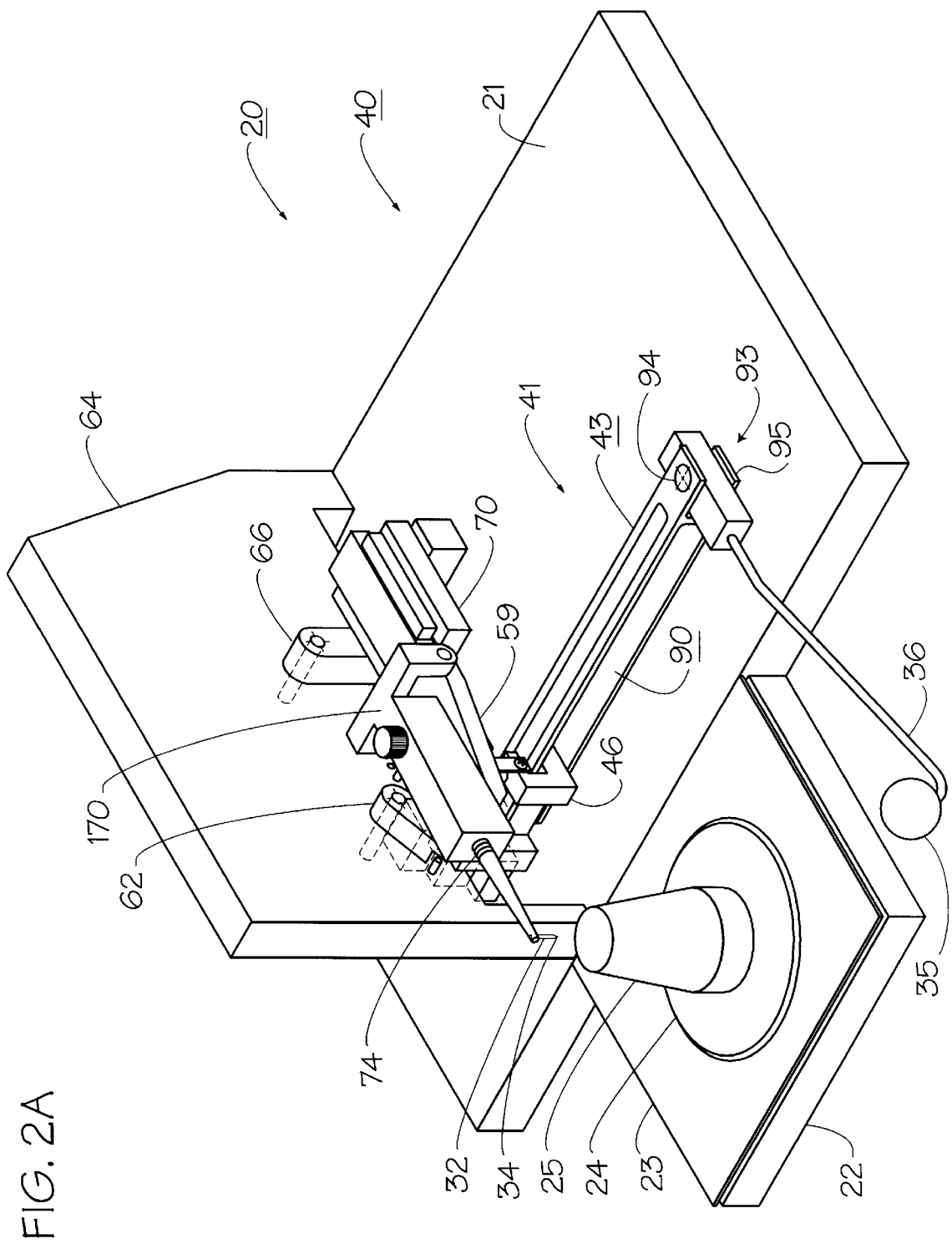
FIG. 2A is a right front upper perspective view of the micropositioner apparatus of FIG. 1.

FIG. 2 shows a micropositioner apparatus 40 according to the present invention, operably connected with other elements to comprise a complete manually operated ultrasonic bonding machine 20. The bonding machine is used to make ultrasonic wire bonds on miniature electronic components such as monolithic or hybrid microcircuits. Bonding apparatus 20 includes a base plate 21 on which is mounted a micropositioner apparatus 40, which is described in detail below. Base plate 21 has a forwardly extending rectangular extension 22 which supports a work table 23 that preferably includes a turntable 24 for rotatably supporting a pedestal 25, which in turn is used for holding a microcircuit or other workpiece.

Figure 1:
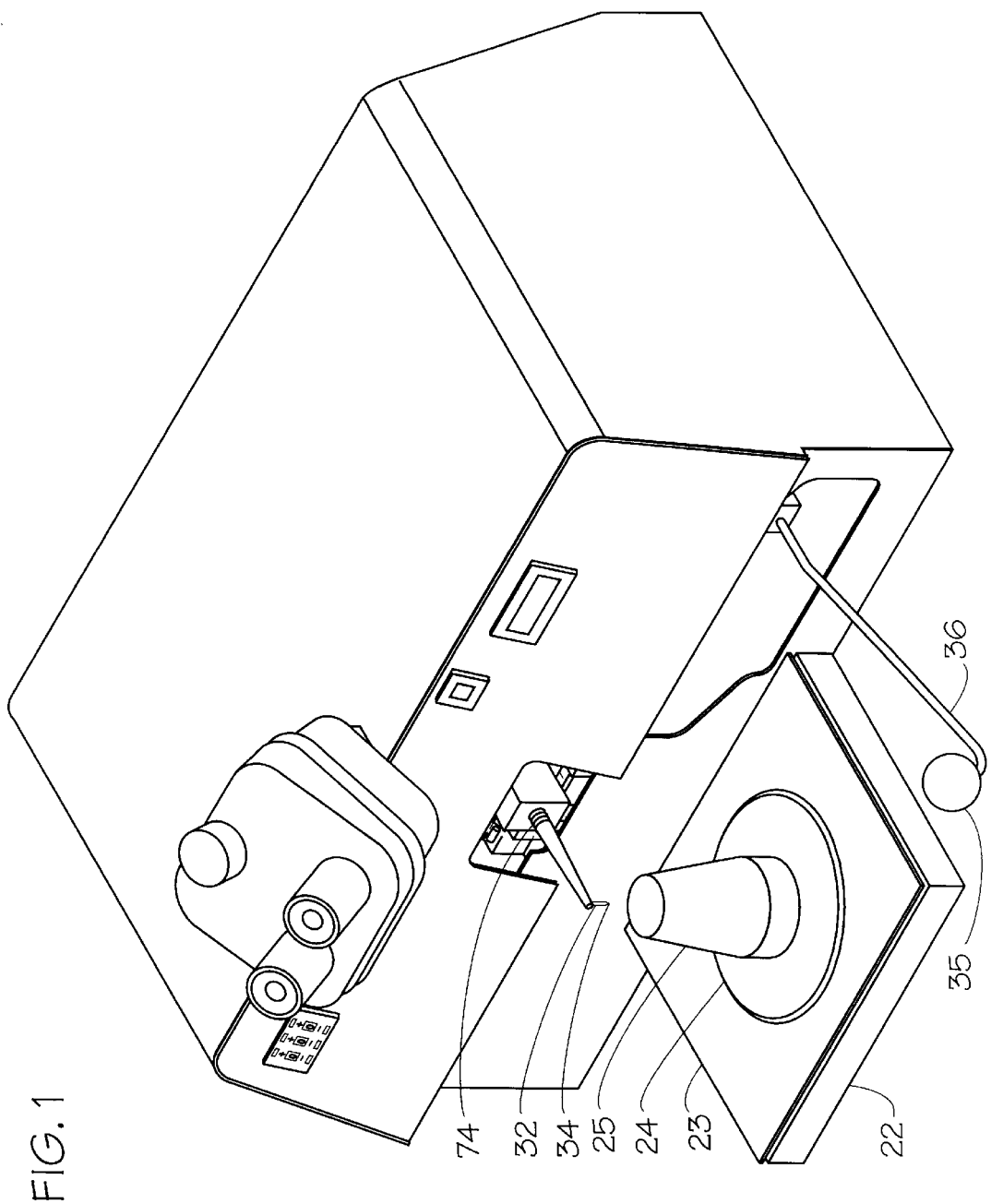
FIG. 1 is a front perspective view of a micropositioner apparatus for ultrasonic bonding according to the present invention, showing the apparatus in combination with other elements to comprise an ultrasonic bonding apparatus.

Referring to FIG. 1, ultrasonic bonding apparatus 20 may be seen to include a housing 26 having an upper panel 27 on which is mounted a stereoscopic microscope 28. Microscope 28 has a field of view which encompasses a microcircuit or other such workpiece A placed on the upper surface of pedestal 25. Housing 26 includes a front panel 29 on which are mounted various controls 30 such as switches, and indicating devices 31.

Ultrasonic bonding apparatus 20 includes an ultrasonic bonding implement 32 which includes a transducer tip and impedance matching horn 74A which protrudes forward through an opening 33 in front panel 29 of housing 26. An ultrasonic bonding tool 34 having a tapered tip or point 34A protrudes downwards from the outer end of transducer horn 74A. As will be described in detail below, bonding tool 32 is mechanically coupled to micropositioner apparatus 40, located within housing 26, the micropositioner affording means for precisely positioning the tip 24A of ultrasonic bonding tool 34 relative to workpiece A. Positioning of bonding tool tip 34A is accomplished by manually operating a control knob 35 attached to the outer end of a control arm 36 that protrudes longitudinally outwards from front panel 29 of housing 26, through an opening 37 in the front panel.

Referring now to FIG. 2, ultrasonic bonding apparatus 20 of FIG. 1 is shown with housing 26 removed, thereby revealing the micropositioner apparatus 40 according to the present invention. In FIG. 2 and the remaining figures, various electrical, electronic and mechanical components which operatively interact with micropositioner apparatus 40 have been deleted to facilitate an understanding of the novel and advantageous features of the micropositioner apparatus per se. The structure and function of the deleted items are clearly described in the present inventor's prior U.S. Pat. Nos. 3,474,685 and 5,163,728, and the description of those elements contained in the aforementioned patents are hereby incorporated by reference into the present specification.

Figure 9:
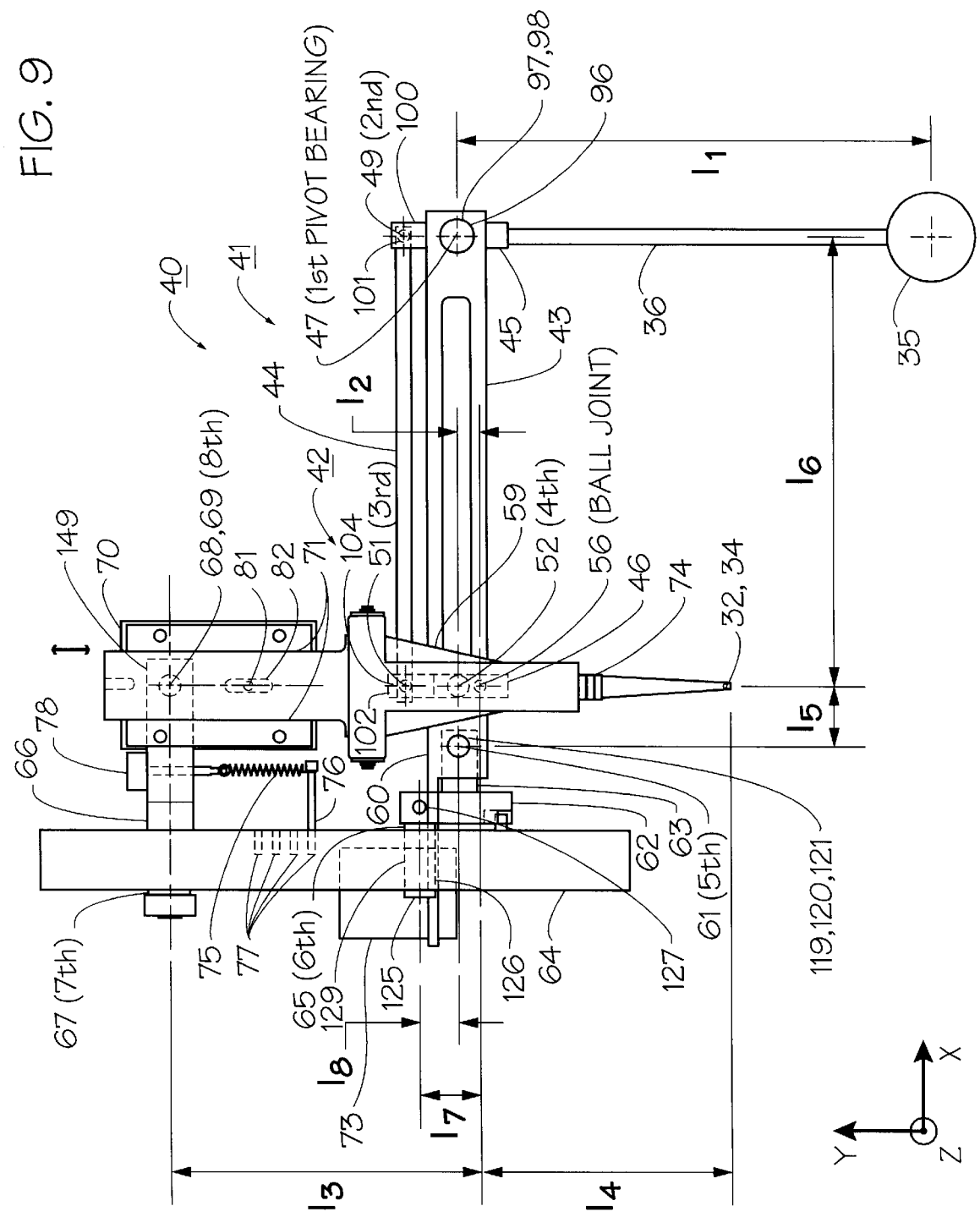
FIG. 9 is a diagrammatic upper plan view of the geometrical configuration of the apparatus of FIG. 2.
Figure 10:
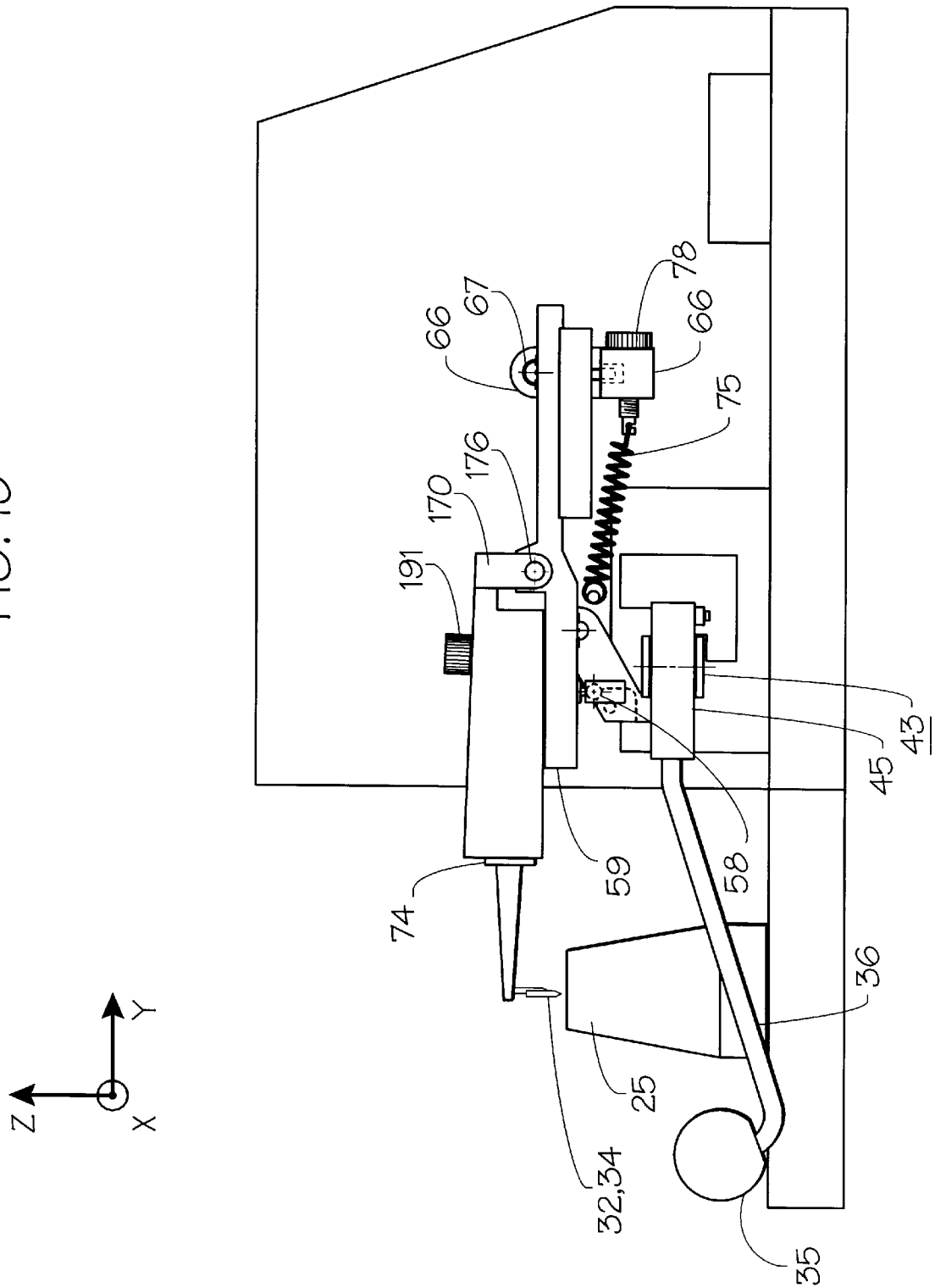
FIG. 10 is a diagrammatic right side elevation view of the geometrical configuration of the apparatus of FIG. 2.
Figure 11:
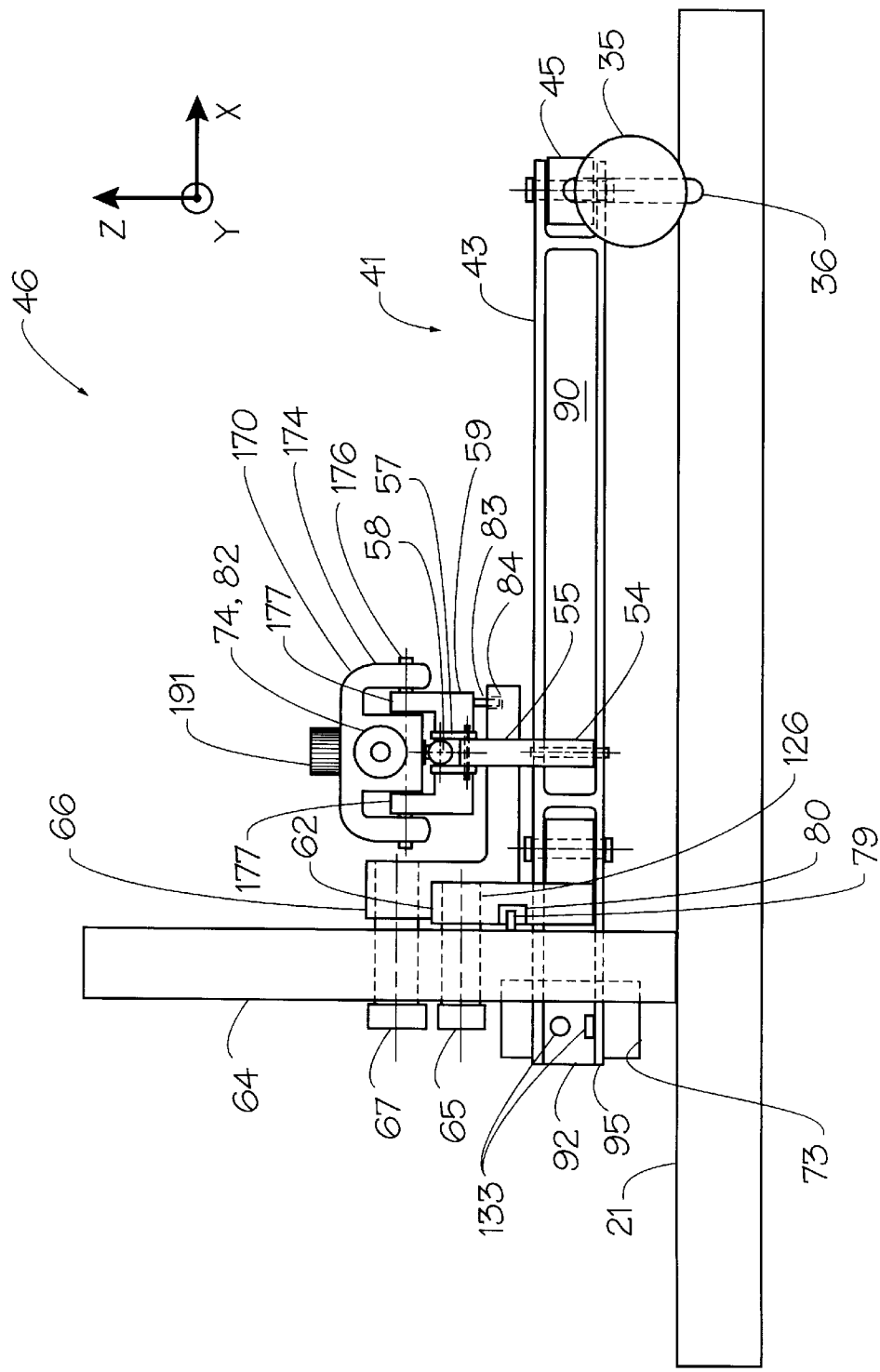
FIG. 11 is a diagrammatic front elevation view of the geometric configuration of the apparatus of FIG. 2.

The structure and function of the novel micropositioner 40 according to the present invention may be more readily understood by first reviewing certain geometrical relationships between various elements of the micropositioner apparatus. Referring now to FIGS. 9, 10 and 11, micropositioner apparatus 40 may be seen to include an input pantograph-like manipulator mechanism, designated generally by the element number 41, and a follower mechanism 42 for movably supporting and precisely positioning ultrasonic bonding tool 32. Input mechanism 41 includes a first, straight laterally disposed front manipulator arm or beam 43 of relatively large cross-section, and a straight rear tie bar 44 of equal length but smaller cross-section. Manipulator arm 43 and tie bar 44 are pivotably joined to form a four-bar, parallelogram linkage, by short, straight longitudinally disposed outer and inner linkage bars 45 and 46, respectively. Thus, as shown in FIG. 9, a first, front outer pantograph pivot bearing 47 having a pivot axis disposed perpendicularly to front manipulator arm 43 joins the front manipulator arm to short, longitudinally disposed outer linkage bar 45. The inner or rear end of outer linkage bar 45 is joined to rear tie bar 44 by a second, rear outer pantograph pivot bearing 49 having a pivot axis parallel to that of first pivot bearing 47. Outer linkage bar 45 has a portion that protrudes forward from first pivot bearing 47, beyond manipulator arm 43, where it is attached to the inner end of manipulator input control arm 36.

Referring still to FIG. 9, short inner linkage bar 46 of input pantograph mechanism 41 may be seen to be pivotably joined at an inner or rear longitudinal end thereof to the inner lateral end of tie bar 44, by means of a third, rear inner pantograph pivot bearing 51 having an axis parallel to those of pivot bearings one and two. Inner linkage bar 46 is also pivotably joined to manipulator arm 43 by a fourth, front inner pantograph pivot bearing 52 having a pivot axis parallel to those of bearings one, two and three. As may be seen best by referring to FIG. 10, inner linkage bar 46 also has a section 53 that protrudes forward beyond the front edge of manipulator arm 43, the forward protruding section having an upwardly protruding vertical leg section 54. Vertical leg section 50 is joined at the upper end thereof by a rearwardly protruding horizontal coupling bar section 55 that partially overlies the upper wall surface of manipulator arm 43.

As may be seen best by referring to FIGS. 10 and 11 in addition to FIG. 9, upper coupling bar section 55 of inner linkage vertical bar 50 has protruding perpendicularly upwards therefrom a socket 57 for a ball joint 56. As shown in FIG. 9, the vertical axis of ball joint 56 is located forward of the axis of fourth front inner pantograph pivot bearing 52. Ball joint 56 includes ball 58 that protrudes downwards from a tool support plate 59.

Referring again primarily to FIG. 9, it may be seen that manipulator arm 43 has an extension portion 60 that protrudes laterally inwards to the left of fourth front inner pantograph pivot joint bearing 52. Extension 60 is pivotably joined by a fifth, manipulator arm support pivot bearing 61 to a laterally outwardly protruding lug 63 of a manipulator arm hanger 62. Fifth pivot bearing 61 is parallel to and longitudinally aligned with first and fourth pivot bearings 47 and 52.

As shown in FIGS. 9 and 11, manipulator arm hanger 62 is pivotably joined by a sixth, hanger support pivot bearing 65 to a vertical support plate 64 which protrudes upwards from base plate 21 of micropositioner apparatus 40. The axis of sixth pivot bearing 65 is oriented horizontally, i.e., parallel to base plate 21 and serves as the primary support member for manipulator arm 43 and the other previously described components of input pantograph mechanism 41.

Referring now to FIGS. 9 and 10, it may be seen that micropositioner apparatus 40 includes a rear tool support yoke 66 that is pivotably joined to vertical support plate 64 by a seventh, yoke support pivot bearing 67. That bearing has a horizontally disposed pivot axis. As shown in FIG. 9, rear tool support yoke 66 has a perpendicularly upwardly protruding pin 69 forming the pivot axis of an eight, tool support pivot joint 68. That joint pivotably supports tool support guide plate 70, which in turn longitudinally slidably supports the rear portion of tool support plate 59, by a pair of laterally opposed, longitudinally disposed linear roller bearings 71.

As shown in FIGS. 9 and 10, the extension 60 of manipulator arm 43 protrudes laterally inward through a large aperture 72 provided through vertical support plate 64. A counterweight 73 located on the left side of vertical support plate 64 is attached to that portion of manipulator arm 60 that protrudes through aperture 72 in the support plate. One function of counterweight 73 is to exert a clockwise (as viewed from the right) moment about the horizontally disposed axis of hanger support pivot bearing 65, which rotatably supports hanger 62 of manipulator arm 43. The clockwise moment tends to equilibrate the counterclockwise moment exerted on manipulator arm 43 by the weight of control handle and knob 36 and 35, respectively. This counterbalancing action of counterweight 73 is also effective in the plane viewed from above in that its weight is disposed about the vertical pivot 61 opposite to the weight of the right portion of the manipulator assembly, items 30, 36, 45, and 43, and 50 counteracts the fore and aft change of the moment arm of that weight about the horizontal pivot axis 65. Thus equilibrated, tool support plate 59 will tend to stay in a fixed up/down, or Z axis, position.

Since, as shown in FIG. 9, various ultrasonic bonding tools 34 and ultrasonic transducers 74 may be interchangeably mounted from time to time on tool support plate 59, micropositioner apparatus 40 preferably includes means for exerting an adjustable clockwise torque on manipulator arm 43, to compensate for heavier objects attached to the tool support plate. To this end, as shown in FIGS. 9 and 10, a tension spring 75 is provided which is attached at a forward end thereof to a headed screw 76 threaded into a selected one of a plurality of longitudinally aligned and spaced apart threaded holes 77 provided in the right side of vertical support plate 64. The rear end of spring 75 is attached to the shank of a thumbscrew 78 that protrudes forward through a threaded hole in rear tool support yoke 66. Coarse adjustment of Z-axis balance of tool support plate 59 may be accomplished by selecting a particular hole 77 into which spring anchor screw 76 is threaded, while fine adjustment is accomplished by advancing or retracting the shank of thumbscrew 78, which is attached to the rear end of tension spring 75, by turning the thumbscrew in the appropriate direction.

As shown in FIG. 11, vertical axis motion of micropositioner apparatus 40 is limited in both up (plus) and down (minus) directions by a horizontally disposed Z-axis limit pin 79 which protrudes laterally outward from vertical support plate 64, towards the right side thereof. Upward and downward motions of manipulator arm 43 are limited by contact of pin 79 with the lower and upper walls, respectively, of a slot 80 cut in the upper left side of manipulator arm hanger 62.

Micropositioner apparatus 40 also includes separate stop means for limiting X-axis and Y-axis motions of tool support plate 59. Thus, as shown in FIG. 9, a longitudinal or Y-axis motion limiting pin 81 protrudes upwards from tool support guide plate 70 into a longitudinally disposed slot 82 formed in the lower surface of tool support plate 59, the pin and slot combination providing limits on Y-axis motion.

As may be seen best by referring to FIGS. 10 and 11, X-axis motion of tool support plate 59 is limited by contact of a cylindrical X-axis limit pin 83, which protrudes downwards from the lower right-hand corner of tool support guide plate 70, with the walls of an oversized cylindrical bore 84 provided in the upper wall surface of rear tool support yoke 66.

The novel construction of micropositioner apparatus 40 permits the tip 34 of ultrasonic bonding tool 32 to be moved in three different directions parallel to the orthogonal axes of an x, y, z coordinate system containing the tip, responsive and corresponding to motions of input manipulator control ball 35 in a different, X, Y, Z coordinate system. In the preferred embodiment, motions of the tool tip are small fractions of corresponding motions of the input control ball, thus permitting a person having ordinary tactile skills and accompanying hand jitters to precisely position and move tool tip 34 relative to a small workpiece. The ratios between motions of tool tip 34 to corresponding motions of control ball 35 may be calculated by reference to FIGS. 9, 10 and 11. These ratios are:

$$x/X = (l_2/l_1) \times (l_3 + l_4)/l_3$$

$$y/Y = (l_5/l_5 + l_6)$$

$$z/Z = [(l_8 + l_2)/(l_1 + l_8)] \times (l_3 + l_4)/l_3$$

By way of example only, the following dimensions and corresponding motion ratios have been found to be suitable:

$l_1$=8 inches $l_2$=0.4375 inch $l_3$=5.25 inches $l_4$=6.75 inches $l_5$=1.071429 inches $l_6$=7.5 inches $l_7 = l_8 + l_2 = 0.5625 + 0.4375 = 1.0$ inch $l_8$=0.5625 inches $x/X = (0.4375 \div 8) \times (5.25 + 6.75) \div (5.25) = +e,$fra 1,8+ee $y/Y = 1.071429/(1.07429 + 7.5) = \frac{1}{8}$ $z/Z = [(0.5625 + 0.4375) \div (8 + 0.5625)][(5.25 + 6.75) \div 5.25)] = \frac{1}{3.75}$ Further details of the novel structure and function of micropositioner apparatus 40 according to the present invention may be better understood by reference to FIGS. 3–8 in addition to FIGS. 1 and 2 and 9–11, which were referenced above in conjunction with the foregoing description of certain geometric aspects of the apparatus.

Referring now to FIGS. 2 and 3–5, manipulator arm 43 may be seen to have the shape of a hollow, generally rectangular and preferably square cross-section beam. Preferably, the walls of manipulator arm 4A have elongated apertures 90 therein to reduce the weight of the manipulator arm. Also, the outer lateral ends of front and rear side walls 91 and 92 of manipulator arm 43 preferably have formed therein a laterally inwardly extending rectangular slot 93. The outer lateral ends of upper and lower side walls 94 and 95, respectively, bounding slot 93 form a bifurcated structure having an opening, which receives outer linkage bar 45. First, front outer pantograph pivot bearing 47 pivotably joining outer linkage bar 45 to manipulator arm 43 includes a pivot axle pin 96 that is received through vertically aligned holes 97 and 98 through the outer bifurcated end portions of upper and lower side walls 94 and 95 of manipulator arm 43, and is held therein by upper and lower E-rings 99 snapped into annular grooves 100 formed in the upper and lower ends of pivot axle pin 96.

Tie bar 44 of input pantograph mechanism 41 preferably consists of a thin, rectangular cross-section bar, the outer lateral end of which is pivotably fastened to the lower surface of a rear extension 100 of outer linkage bar 45 that protrudes rearward through slotted opening 93 in the outer lateral end of manipulator arm 43, by means of a headed pivot pin 101 which is received in aligned holes provided through the tie bar and into the bottom of the rear linkage bar extension, thus forming rear outer pantograph bearing 49. Similarly, the inner lateral end of tie bar 44 is pivotably attached to the lower surface of an extension portion 102 of inner linkage bar 46 that protrudes rearward through a laterally elongated, rectangularly-shaped aperture 103 provided through the rear side wall 92 of manipulator arm 43, near the inner lateral end of the manipulator arm. This third, rear inner pantograph pivot bearing is formed by a headed pivot pin 104 which is rotatably received through a clearance hole provided through the bar 44, and anchored in a blind bore provided into the bottom surface of rear extension 102 of inner linkage bar 46.

Inner linkage bar 46 also has a forwardly protruding section 53 that protrudes forward through a rectangularly-shaped aperture 106 provided through front side wall 91 of manipulator arm 43. The central portion of inner linkage bar 46 is pivotably joined to manipulator arm 43 by a fourth, front inner pantograph bearing 52. This bearing is comprised of a pivot axle pin 107 that is received through vertically aligned holes 10 and 109 through the upper and lower side walls 94 and 95 of manipulator arm 43. Pivot axle pin 107 is held in place by upper and lower E-rings snapped into annular grooves 110 formed in the upper and lower ends of pivot axle pin 107.

Figure 2B:
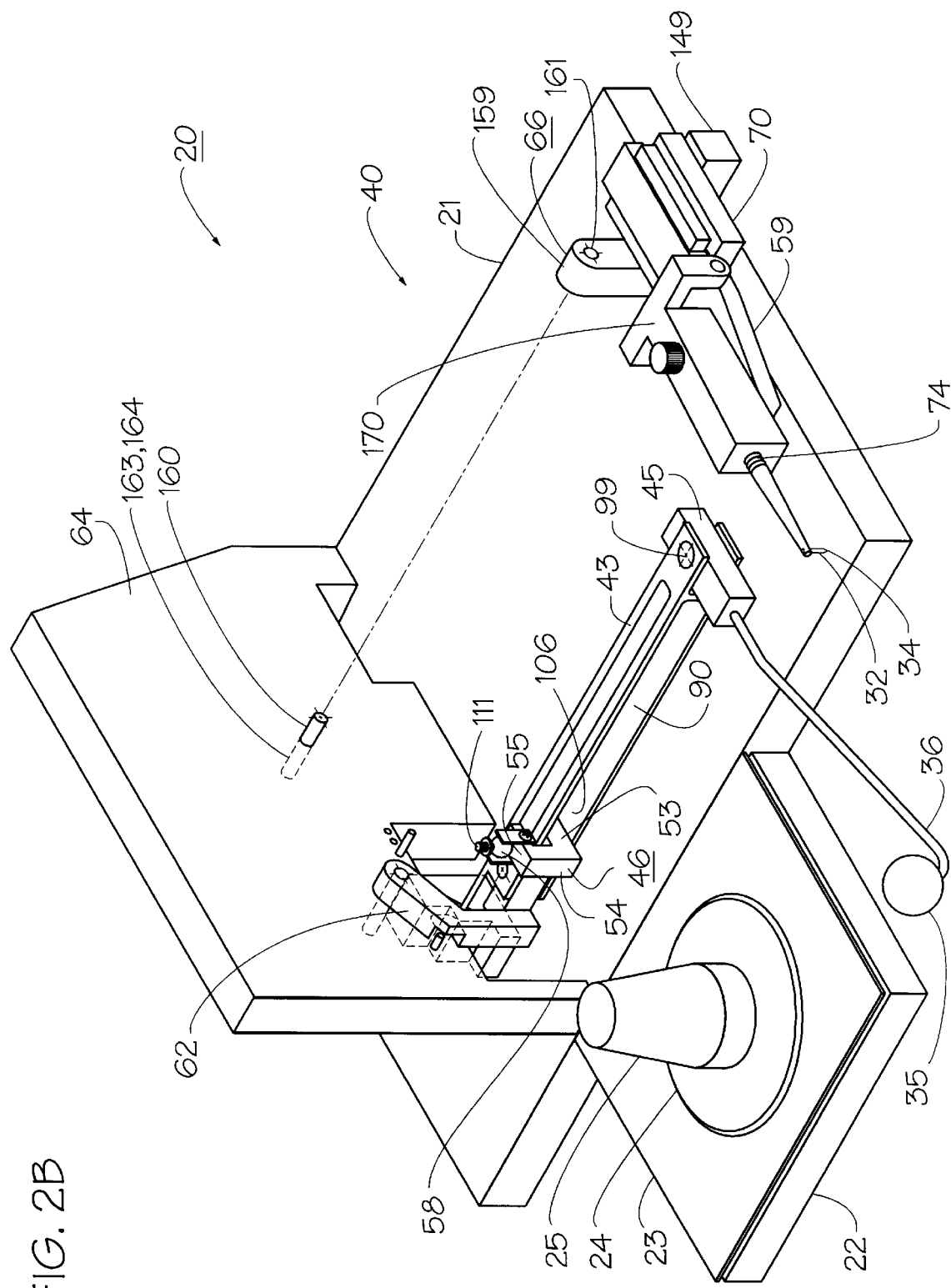
FIG. 2B is an exploded front perspective view of the apparatus of FIG. 1.
Figure 4:
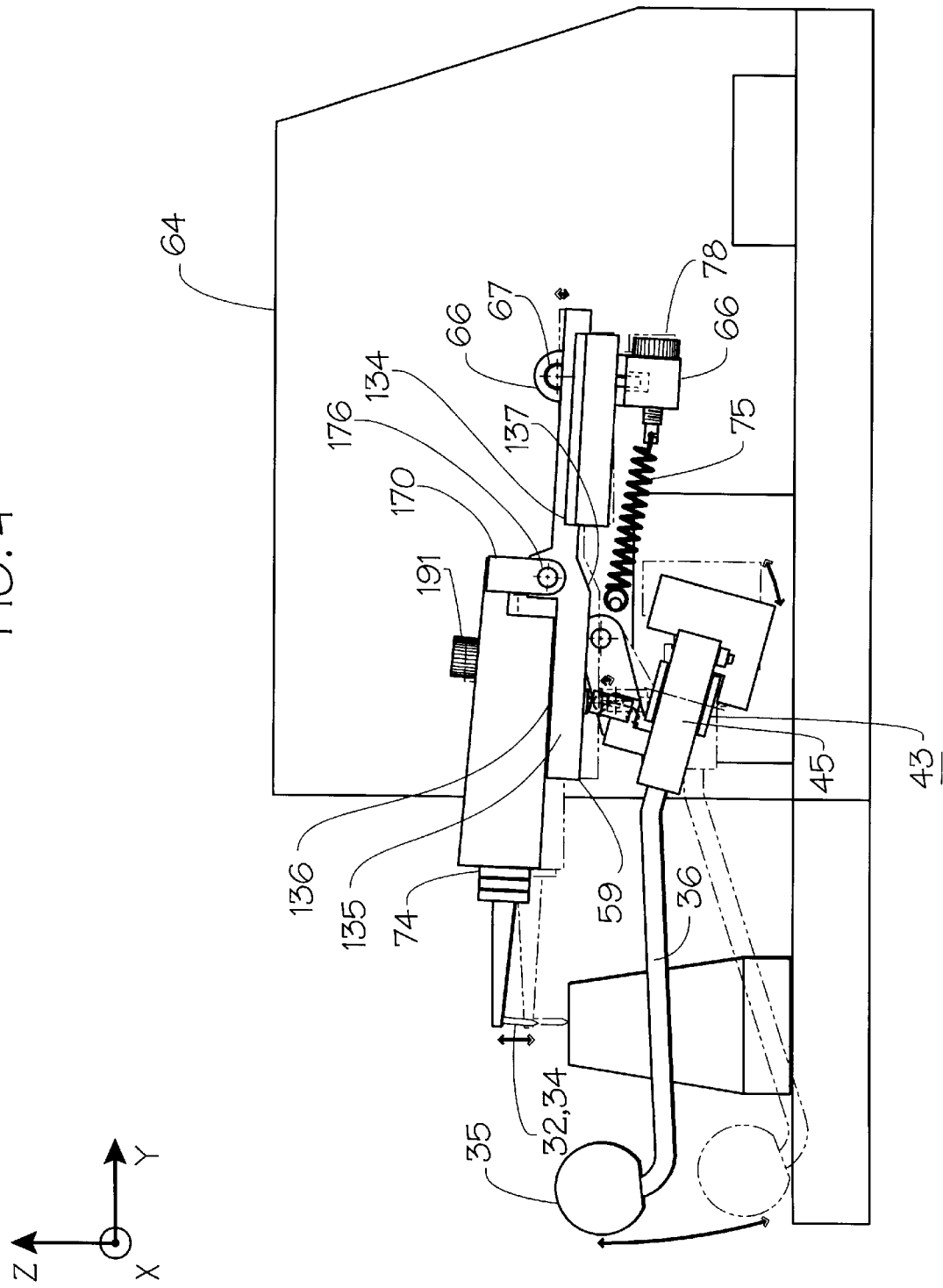
FIG. 4 is a right side elevation view of the apparatus of FIG. 2, showing the tool thereof in an elevated position.
Figure 5:
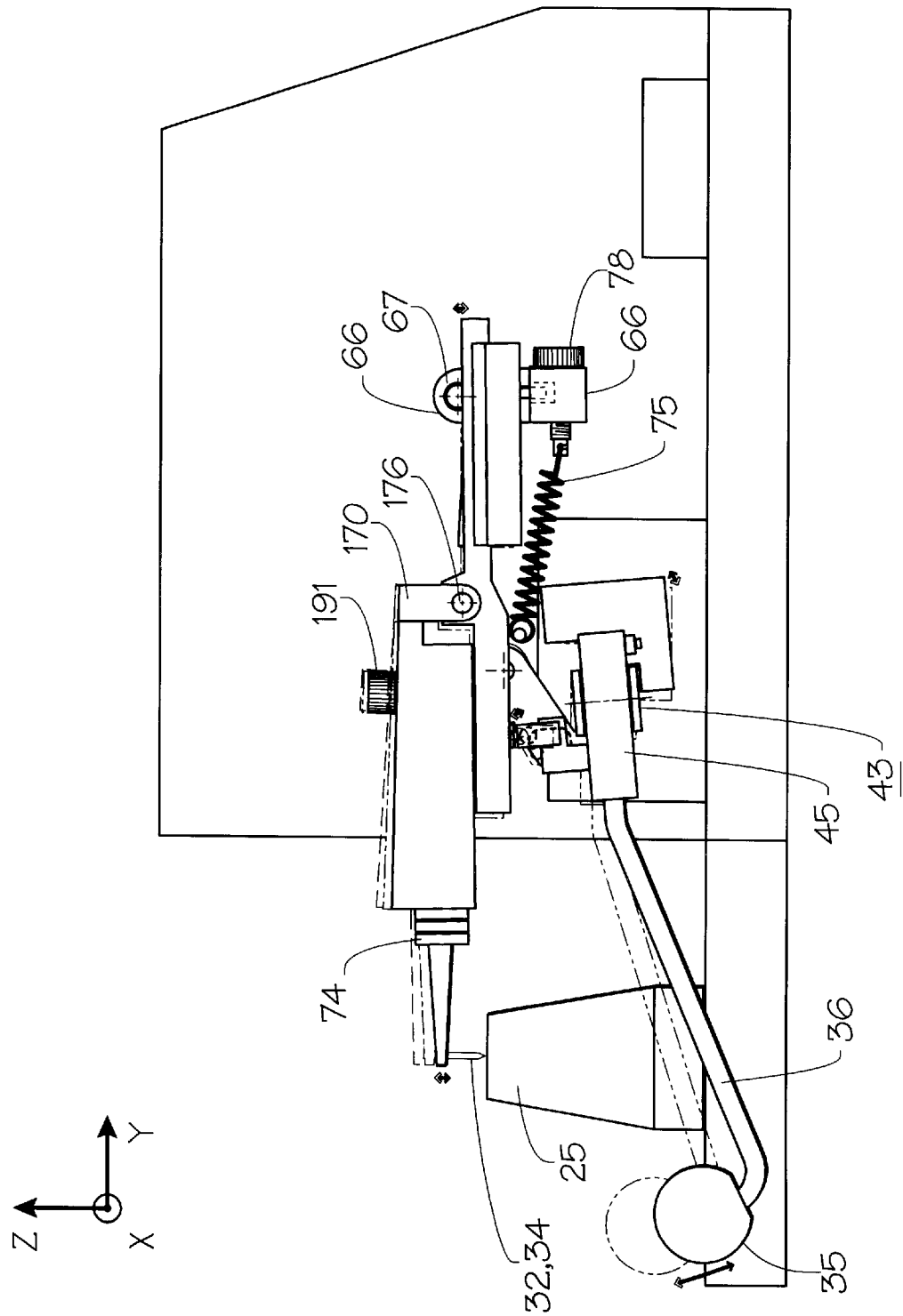
FIG. 5 is a view similar to that of FIG. 4, but showing the tool thereof lowered to a bonding position.

As shown in FIGS. 2B and 10, forwardly protruding section 53 of inner linkage bar 46, which protrudes forward through aperture 106 in front wall 91 of manipulator arm 43, is terminated at the outer or forward end thereof by a perpendicularly upwardly protruding, vertical leg section 54. Vertical leg section 54 is terminated at the upper end thereof by a horizontally disposed, rectangular-shaped section 55 that protrudes upwardly rearward to partially overlie manipulator arm 43, and spaced above the upper wall 94 of the manipulator arm.

As may be seen best by referring to FIGS. 2B and 3, upper section 55 of inner linkage bar 46 serves as a coupling bar for coupling input pantograph mechanism 41 to follower mechanism 42, by means of a ball joint type coupling 56. As shown in FIGS. 2B and 11, ball joint coupling 56 includes a ball 58 having a stud 111 which is lockingly received in the lower wall surface 112 of tool support plate 59. Ball 58 is received in a socket 57 that protrudes upwards from coupling bar portion 55 of inner linkage bar 46. Socket 57 is formed by the combination of a rigid, hardened steel plate 113 having formed therein a concave depression in an inner surface therein and attached to the left side wall 114 of coupling bar 55, and a steel leaf spring 115 backed by a rigid steel plate 116 and attached to the right side wall 117 of the coupling bar.

Referring now to FIGS. 6, 7, 9 and 11, it may be seen that manipulator arm 43 has a left lateral end portion or extension 60 that protrudes laterally inwards to the left of fourth, front inner pantograph bearing 52. Front wall 91, and the front portion of upper and lower walls 94 and 95 of the inner end portion of left lateral extension 60 of manipulator arm 43 are cut away to from a laterally rightward extending rectangular slot 118. The leftward protruding lateral ends of upper and lower side walls 94 and 95, respectively, form a bifurcated structure having an opening which receives rectangular cross-section lug 63 that protrudes laterally outwards from manipulator arm hanger 62. Fifth, pantograph mechanism support bearing 61 joining inner end 60 of manipulator arm 43 to lug 63 of manipulator arm hanger 62 includes a pivot axle pin 119 that is received through vertically aligned holes 120 and 121 through the bifurcated end portion of upper and lower side walls 94 and 95 of the manipulator arm. Axle pin 191 is held in place by upper and lower E-rings 122 mapped into annular grooves 123 formed in the upper and lower ends of the pivot axle pin. Thus constructed, manipulator arm beam 43 may be pivoted rearward about hanger lug 63, since front wall 91 adjacent to slot 118 is cut away. However, since rear wall 92 of manipulator arm beam 43, as well as rear portions of upper and lower side walls 94 and 95 of arm extension 60 protruding leftward beyond slot 118 are left intact, rearward pivot motion of the manipulator arm is made possible by providing a laterally elongated, rectangularly-shaped aperture 124 through rear wall 92 of the beam, rearward of hanger lug 63, the aperture allowing rearward movement of the hanger lug therethrough.

As shown in FIGS. 2B, 6, 7 and 11, manipulator arm hanger 62 is pivotably joined by sixth, hanger support bearing 65 to vertical support plate 64. Bearing 65 comprises an axle pin 125 that protrudes laterally through a bore 126 inward to the left of manipulator hanger 62, the axle pin being held fixed by means of a set screw 127 screwed into a threaded bore that intersects the axle pin bore. Axle pin 125 is rotatably held in a journal 129 that is in turn held within a bore 130 through vertical support plate 64. Axle pin 125 is maintained in a fixed longitudinal position by means of a clamp 131 which grips the axle pin. Clamp 131 has an annular face which bears against a friction adjusting washer 132, the opposite annular surface of the washer bearing against the inner annular end wall of journal 129.

Figure 6:
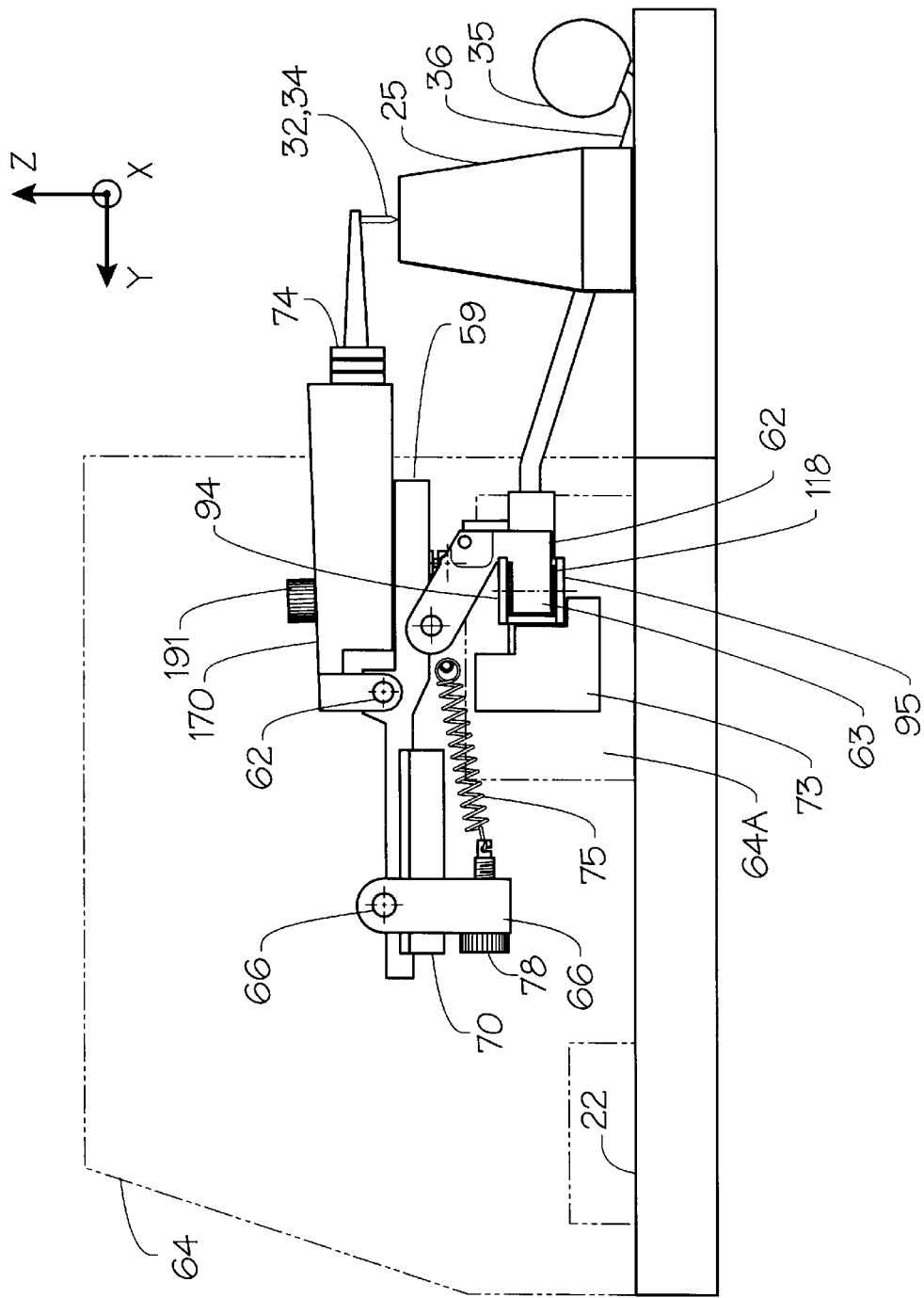
FIG. 6 is a left side elevation view of the apparatus of FIG. 2.
Figure 7:
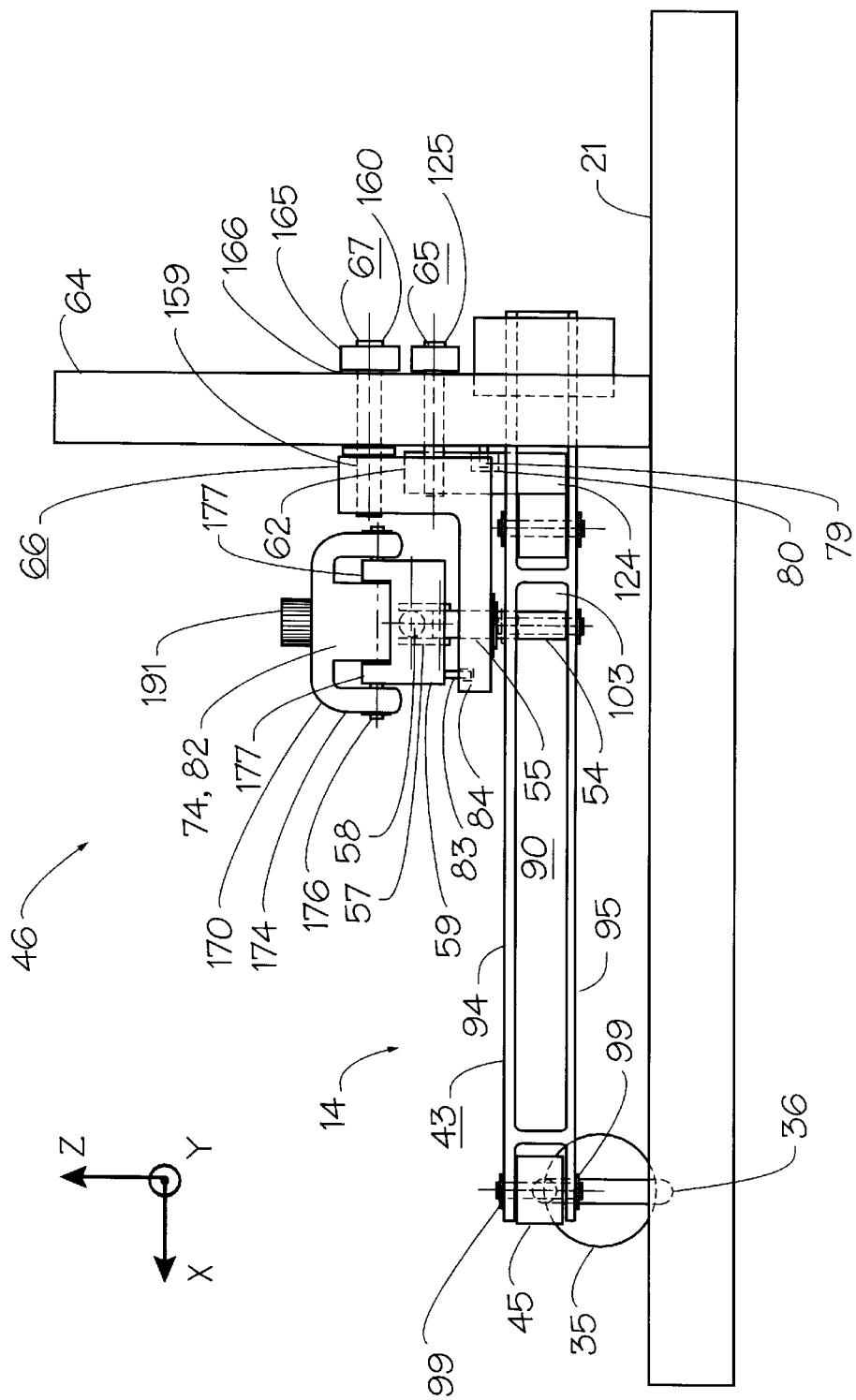
FIG. 7 is a rear elevation view of the apparatus of FIG. 2.

As may be seen best by referring to FIGS. 6, 7. 9 and 11, rear wall portion 92 and cut-back upper and lower walls 94 and 95 of inner extension 60 of manipulator beam 43 protrude laterally inward through a large, generally rectangularly-shaped aperture provided through the front portion of vertical support plate 64. Here the end portions of the lower and rear beam side walls are fastened by screws 133 to the front wall surface of counterweight 73, which has a two-step, stairway-like front surface, and a uniform lateral thickness As may be seen best by referring to FIGS. 8 and 9, tool support plate 59 has in plan view the shape of longitudinally elongated, rectangular rear plate section 134, and an arrowhead-shaped front section 135. As may be seen best by referring to FIG. 4, rear rectangular plate section 134 of tool support plate 59 is of generally uniform thickness, while the front arrowhead-shaped section 135 is somewhat thicker, and has downwardly stepped upper and lower parallel walls 136 and 137, respectively.

Figure 8:
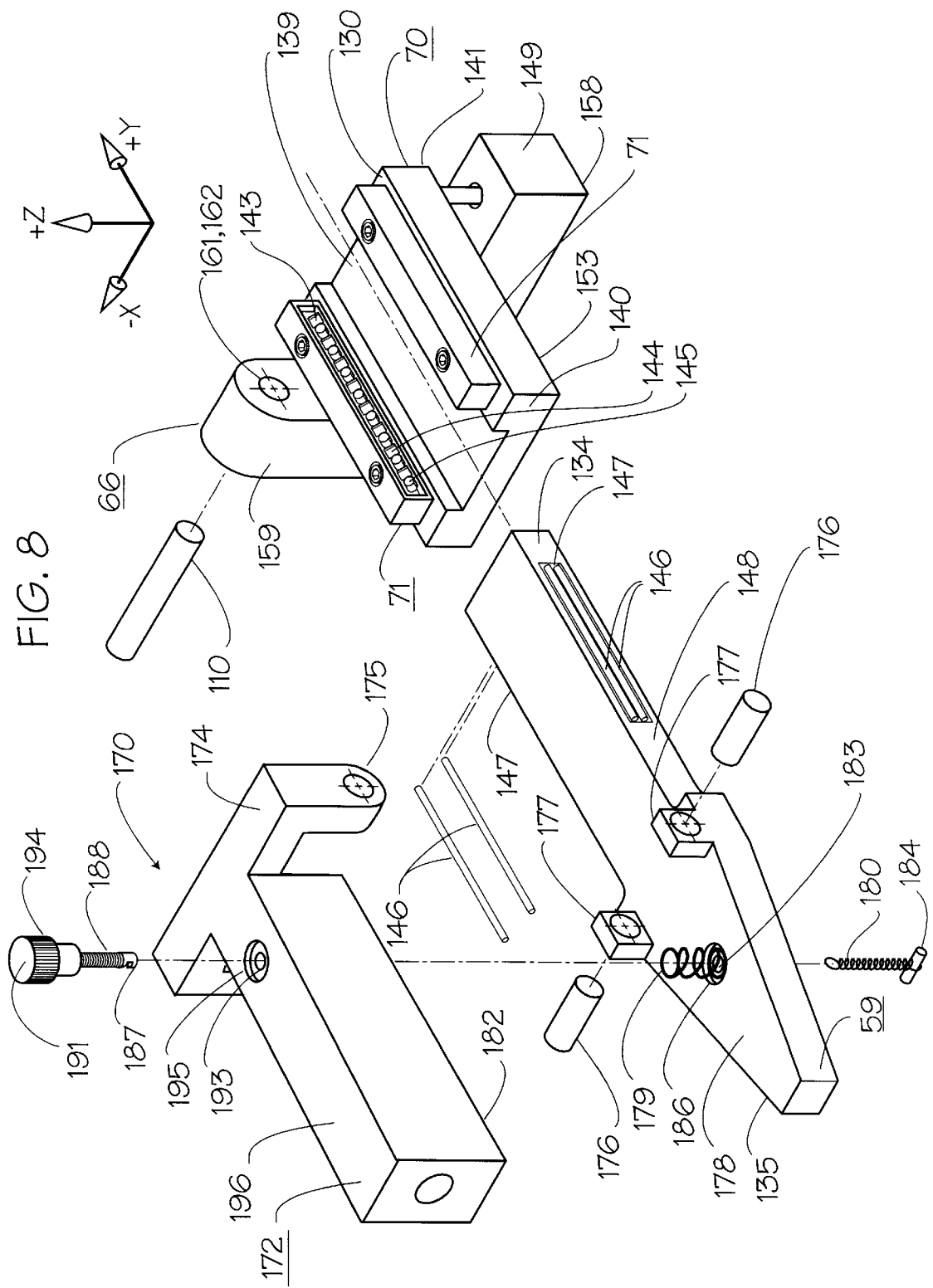
FIG. 8 is an exploded fragmentary perspective view of the apparatus of FIG. 2 showing a linear bearing thereof.

As shown in FIGS. 7, 8 and 9, rear plate section 134 of tool support plate 59 is slidably supported in tool support guide plate 70. Tool support guide plate 70 has in plan view a longitudinally elongated rectangular shape, that has formed in the upper wall 130 thereof of a longitudinally elongated, shallow, rectangular cross-section groove 139 which penetrates both the front wall 140 and rear wall 141 of the tool support guide plate. Groove 139 provides clearance for rear rectangular plate section 134 of tool support plate 59, which is longitudinally slidably supported by a pair of laterally opposed, longitudinally disposed linear roller bearings 71. Structural details of roller bearings 71 may be best understood by referring to FIG. 8. As shown in FIG. 8, roller bearings 71 have short cylindrical rollers 143 held by races 144 within elongated rectangular housings 145. Rollers 143 rollably contact a pair of vertically spaced apart, longitudinally disposed elongated cylindrical pins 146 made of hardened steel, and which are located in longitudinally elongated grooves 147 provided in side walls 148 of rear plate section 134 of tool support plate 59.

Referring now to FIGS. 2B, 7, 9, 10 and 11, it may be seen that tool support guide plate 70 is rotatably supported on the laterally outwardly projecting leg 149 of yoke 66 by eighth, tool support pivot bearing 68. Tool support bearing 68 includes a downwardly protruding axle 150 which is fixed in a blind bore 151 provided in the lower surface of a cylindrical boss 152 which protrudes downwards from the lower wall 153 of tool support guide plate 70. Axle 150 is rotatably received through a journal 154 fixed in a bore 155 through horizontal yoke leg 149 of yoke 66, and longitudinally fixed by means of a clamp 156 and washer fitted over that portion of the axle which protrudes below lower wall surface 158 of the horizontal yoke leg.

As may be seen best by referring to FIGS. 2B and 7, tool support yoke 66 has an inner vertically disposed leg 159 that is pivotably joined by seventh, yoke support bearing 67 to vertical support plate 64. Bearing 63 includes an axle 160 that is fixed in a bore 161 through the upper end of the vertically disposed yoke leg 159, the axle protruding laterally inward to the left of the yoke leg through a bushing 162. Axle 160 is rotatably held in a journal 163 that is fixed within a bore 164 provided through vertical support plate 64. Axle pin 160 is maintained in a fixed longitudinal position by means of a clamp 165 which grips the left end portion of the axle pin, a bushing 166 being positioned between the left wall 167 of the vertical support plate and the clamp.

Referring now to FIGS. 2, 6 and 7, micropositioner apparatus 40 may be seen to preferably include a transducer mount assembly 170 for holding an ultrasonic transducer 74, and attached ultrasonic bonding tool 34. As shown in those figures, transducer mount assembly 170 includes a longitudinally elongated, generally rectangular cross-section body 172 having attached to rear wall 173 thereof an inverted U-shaped pivot yoke 174. The outer lower ends 175 of yoke 174 are attached to tool support plate 59 by a pair of laterally opposed and aligned pivot pins 176, which are in turn pivotably fastened to a laterally opposed pair of lugs 177 which protrude upwards from the upper surface 178 of tool support plate 59. Body 172 is thus allowed to pivot upwards in a vertical plane, in response to an upward reaction force exerted in response to downward pressure exerted on a workpiece by tip 34A of ultrasonic bonding tool 34.

In the preferred embodiment, body 172 of transducer mount assembly 170 is supported above upper surface 178 of tool support plate 59 by a pair of coaxial outer and inner coil springs 179 and 180, respectively. As may be seen best by referring to FIG. 4, outer spring 179 is an open coil, helical compression spring the upper end of which fits in a counterbore 181 in lower wall surface 182 of body 172 of transducer mount assembly 170. The lower end of spring 179 is received in a counterbore 183 in the upper wall surface 178 of tool support plate 59.

Inner spring 180 is a closed coil, helical tension spring, and is held at the lower end thereof by a transversely attached pin 184 which fits in a transverse notch 185 formed in the lower entrance of a bore 186 through tool support plate 59. The upper end of inner tension spring 180 is held in a slot 187 formed in the lower end of a threaded shank 188 a stud 189 which is threadably received in a threaded bore 190 of a thumbscrew 191, the latter having, a reduced diameter portion 192 which fits down through a bore 193 provided through body 172. The enlarged head 194 of thumbscrew 191 is received on a the annular face of a counterbore 195 in upper wall surface 196 of transducer housing body 172.

The novel arrangement of compression spring 179 opposing coaxially enclosed tension spring 180 allows the downward force exerted by tool tip 34A on a workpiece to be limited to a value predetermined by adjusting the tension of spring 180, since tool tip 34A and transducer mount assembly 170 may pivot upwards with respect to tool support plate 59, on transducer mount pivot yoke pivot pins 176, in opposition to tension exerted by the tension spring.

In the preferred embodiment, upward pivotal motion of transducer mount assembly 170 in response to contact of tool tip 34A with a workpiece actuates an electronic switch 197 mounted on the upper surface 198 of support plate 59 and located below the lower surface 199 of the transducer mount assembly. Switch 197 is in turn used to initiate application of electrical drive power to transducer 171.

What is claimed is:

1. A micropositioner apparatus for precisely positioning the tip of a wire bonding tool relative to a workpiece, said apparatus comprising;
   a. a manipulator input mechanism having an input control element movable in a first coordinate system,
   b. a follower mechanism including a tool holder for holding a wire bonding tool and moving the tip of said wire bonding tool in a second coordinate system, and
   c. coupling means joining said manipulator mechanism to said follower mechanism, whereby motions of said input control element in said first coordinate system are operable through said coupling means to effect motions of said tool tip in said second coordinate system.

2. The apparatus of claim 1 wherein said coupling means is further defined as a ball joint joining said follower mechanism to said manipulator input mechanism.

3. The apparatus of claim 1 wherein said motions of said tool tip are resolved into motions along coordinate axes of said second coordinate system that are in a predetermined relationship to motions of said input control element along corresponding coordinate axes of said first coordinate system.

4. The apparatus of claim 3 wherein said motions of said tool tip alone coordinate axes of said second coordinate system are in predetermined ratios with respect to corresponding motions of said input control element along corresponding coordinate axes of said first coordinate system.

5. The apparatus of claim 1 wherein said manipulator input mechanism is further defined as including a four-bar parallelogram linkage.

6. The apparatus of claim 5 wherein said four-bar parallelogram linkage is further defined as being pivotably mounted at an end thereof to a hanger bracket by a parallelogram support bearing.

7. The apparatus of claim 6 wherein said hanger bracket is further defined as being pivotably mounted to a support structure by a hanger support bearing having a pivot axis perpendicular to the pivot axis of said parallelogram support bearing.

8. The apparatus of claim 7 wherein said tool is further defined as protruding forward beyond said hanger support bearing.

9. The apparatus of claim 8 wherein said tool holder is further defined as having a portion protruding rearward of said hanger support bearing.

10. The apparatus of claim 9 further including rear yaw pivot means for pivotably supporting said rear portion of said tool holder so as to permit lateral motion on said tool tip.

11. The apparatus of claim 10 further including slide bearing means for slidably supporting said tool holder so as to permit longitudinal motion of said tool tip.

12. The apparatus of claim 9 further including slide bearing means for slidably supporting said tool holder so as to permit longitudinal motion of said tool tip.

13. The apparatus of claim 12 further including rear pitch pivot means for pivotably supporting said rearward portion of said tool holder so as to permit pivotable motion in a vertical plane of the tip of said tool and said rear portion of said tool holder.

14. The apparatus of claim 9 further including rear pitch pivot means for pivotably supporting said rearward protruding portion of said tool holder so as to permit pivotal motion in a vertical plane of the tip of said tool and said rear portion of said tool holder.

15. The apparatus of claim 14 further including, rear yaw pivot means for pivotably supporting said rear portion of said tool holder so as to permit lateral motion of said tool tip.

16. The apparatus of claim 15 further including slide bearing means for slidably supporting said tool holder so as to permit longitudinal motion of said tool tip.

17. The apparatus of claim 16 wherein the longitudinal line of action of said tool tip afforded by said slide bearing means, the pivot axis of said rear pitch pivot means, and the pivot axis of said rear yaw pivot means have a common intersection point.

18. The apparatus of claim 14 wherein said tool holder is further defined as having a transducer mount assembly for holding said tool, said transducer mount assembly being pivotably mounted with respect to said rear portion of said tool holder by means of a transducer mount assembly pivot means, whereby the tip of said tool may pivot upwards with respect to said tool holder.

19. The apparatus of claim 18 wherein said transducer mount assembly pivot means is further defined as including force adjusting means, whereby the downward force exerted on a workpiece in response to contact by said tool tip may be limited to a predetermined value.

20. The apparatus of claim 19 further including sensor means for sensing when said tool tip has contacted said work-piece with a predetermined force, said sensor means being operably interconnected to a source of bonding energy conducted to said tool tip, whereby said predetermined force initiates bonding action on said workpiece.

* * * * *